United States Patent
Abugharbieh et al.

(10) Patent No.: US 6,275,116 B1
(45) Date of Patent: Aug. 14, 2001

(54) METHOD, CIRCUIT AND/OR ARCHITECTURE TO IMPROVE THE FREQUENCY RANGE OF A VOLTAGE CONTROLLED OSCILLATOR

(75) Inventors: Khaldoon Abugharbieh, Sunnyvale; Sung-Ki Min, Cupertino, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/328,083

(22) Filed: Jun. 8, 1999

(51) Int. Cl.[7] .................................................... H03L 7/099
(52) U.S. Cl. ................. 331/34; 331/16; 331/17; 331/177 R
(58) Field of Search .................................. 331/16, 17, 34, 331/57, 177 R

(56) References Cited

U.S. PATENT DOCUMENTS 5,412,349 * 5/1995 Young et al. .......................... 331/34
6,005,444 * 12/1999 Carpelan ............................... 331/16

* cited by examiner

Primary Examiner—Arnold Kinkead
(74) Attorney, Agent, or Firm—Christopher P. Maiorana, P.C.

(57) ABSTRACT

A circuit comprising an oscillator configured to generate a periodic signal in response to (i) control signal and (ii) a current. The current may be varied independently of the control signal. In one example, the oscillator may generate the periodic signal in further response to a second current that may vary in response to the control signal. In another example, the oscillator may be used in a phase-locked loop circuit.

18 Claims, 3 Drawing Sheets

METHOD, CIRCUIT AND/OR ARCHITECTURE TO IMPROVE THE FREQUENCY RANGE OF A VOLTAGE CONTROLLED OSCILLATOR

FIELD OF THE INVENTION

The present invention relates to oscillators generally and, more particularly, to a method, circuit and/or architecture to improve the frequency range of a voltage controlled oscillator.

BACKGROUND OF THE INVENTION

Referring to FIG. 1, an example of a conventional phase locked loop circuit 10 is shown. The circuit 10 generally comprises phase frequency detector 12, a charge pump 14, a voltage controlled oscillator (VCO) 16 and a divider 18. The circuit 10 is used to multiply a reference signal REFCLK having a fixed frequency, received at an input 24, by some multiple set by the divider 18. The frequency detector 12 is coupled to the VCO 16 through the charge pump/filter 14. The divider circuit 18 has an input 28 that receives a feedback of the signal CLK presented at an output 30 of the VCO 16. The divider 18 presents a signal to an input 32 of the frequency detector 12. Errors coupled through the charge pump 14 cause the VCO 16 to change the frequency of the signal CLK to minimize the error. VCO frequency errors may be managed by the circuit 10. The nominal frequency of operation of the signal CLK will be the frequency of the reference signal REFCLK multiplied by the divider ratio.

The VCO 16 is an integral part of the PLL 10. The gain of the VCO 16 (i.e., the frequency of the signal CLK vs. the change in the input control voltage Vcontrol), and the frequency range of the VCO 16 are two very important design parameters. The gain of the VCO 16 is important to determine the bandwidth of the PLL 10. Also, the gain of the VCO 16 has a significant impact on jitter (i.e., high frequency semi-random displacement of a signal from its ideal location). The frequency of the VCO 16 determines the operating frequency of the PLL 10.

FIG. 2 illustrates a diagram of a conventional VCO 16. The VCO 16 is usually made up of a voltage to current converter 40 and a current controlled oscillator (ICO) 50. The converter 40 comprises a current mirror 42, a comparator 44, a transistor 46 and a resistor R. The frequency of operation of the VCO 16 is directly dependent on the current Ivco received by the ICO 50. The current Ivco is the voltage of the signal Vcontrol divided by the resistance R. The higher the current IVCO, the higher frequency of the signal CLK. The current of the ICO 50 depends on the value of resistor R. Also, the gain of the VCO 16 depends on the value of the resistor R.

The value of the resistance R determines the gain of the VCO 16 (i.e., slope of the F-V curve). Changing the gain of the VCO 16 will also change the frequency of operation of VCO 16. This may put the frequency of the VCO 16 out of the required range.

SUMMARY OF THE INVENTION

The present invention concerns a circuit comprising an oscillator configured to generate a periodic signal in response to (i) control signal and (ii) a current. The current may be varied independently of the control signal. In one example, the oscillator may generate the periodic signal in further response to a second current that may vary in response to the control signal. In another example, the oscillator may be used in a phase-locked loop circuit.

The objects, features and advantages of the present invention include providing an oscillator that may (i) generate a signal having a frequency that may be adjusted without changing the gain of the oscillator, (ii) have an expanded frequency range, (iii) provide an offset current to adjust the frequency, and/or (iv) provide post-production configuration of the oscillator.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
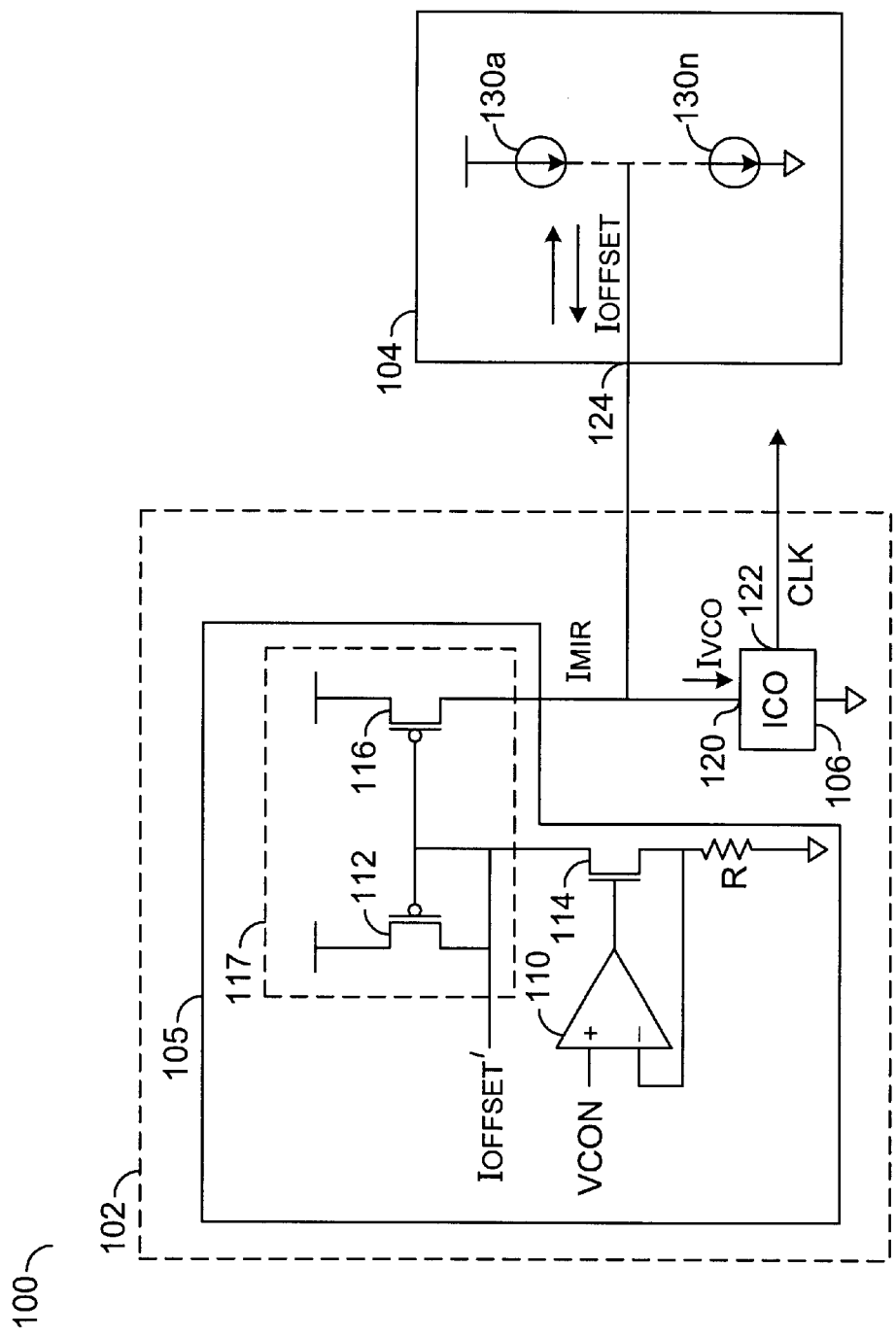
FIG. 3 is a block diagram of a preferred embodiment of the present invention.

Referring to FIG. 3, a block diagram of a circuit 100 is shown in accordance with a preferred embodiment of the present invention. The circuit 100 generally comprises a generation block (or circuit) 102 and an adjustment block (or circuit) 104. The generation block 102 generally comprises a voltage-to-current converter block (or circuit) 105 and a current controlled oscillator (ICO) 106. The converter circuit 105 generally comprises a comparator 110, a transistor 112, a transistor 114, a transistor 116 and a resistor R. The transistor 112 and the transistor 116 may form a current mirror 117. The converter circuit 105 generally presents a current (e.g., Imir) to an input 120 of the ICO 106. The ICO 106 generally presents a signal (e.g., CLK) at an output 122. The adjustment circuit 104 generally presents a current (e.g., Ioffset) at an output 124 that may also be presented to the input 120 of the ICO 106. The current Ioffset is generally added or subtracted from the current Imir, to present a current Ivco, which may ultimately control the frequency of oscillation of the signal CLK. The adjustment circuit 104 generally comprises one or more current sources 130a–130n.

The offset current Ioffset may be independently varied with respect to the signal Vcontrol. The generation of the offset current Ioffset may be added to a VCO structure. In one example, the offset current Ioffset is generally small compared to the current Ivco and may provide fine tuning of the frequency of oscillation of the signal CLK. However, the offset current Ioffset may also provide large variations in the frequency of oscillation of the signal CLK. In general, the frequency of oscillation of the signal CLK may depend on the value of the resistor R plus the value of the current offset Ioffset as defined by the following Equation EQ1:

$$\text{Ivco} = (\text{VCON}/R) +/- \text{Ioffset} \qquad \text{EQ1}$$

However, the current offset Ioffset does not generally affect the gain of the VCO 16, because the gain of the VCO 16 generally depends only on the value of the resistor R.

Figure 1:
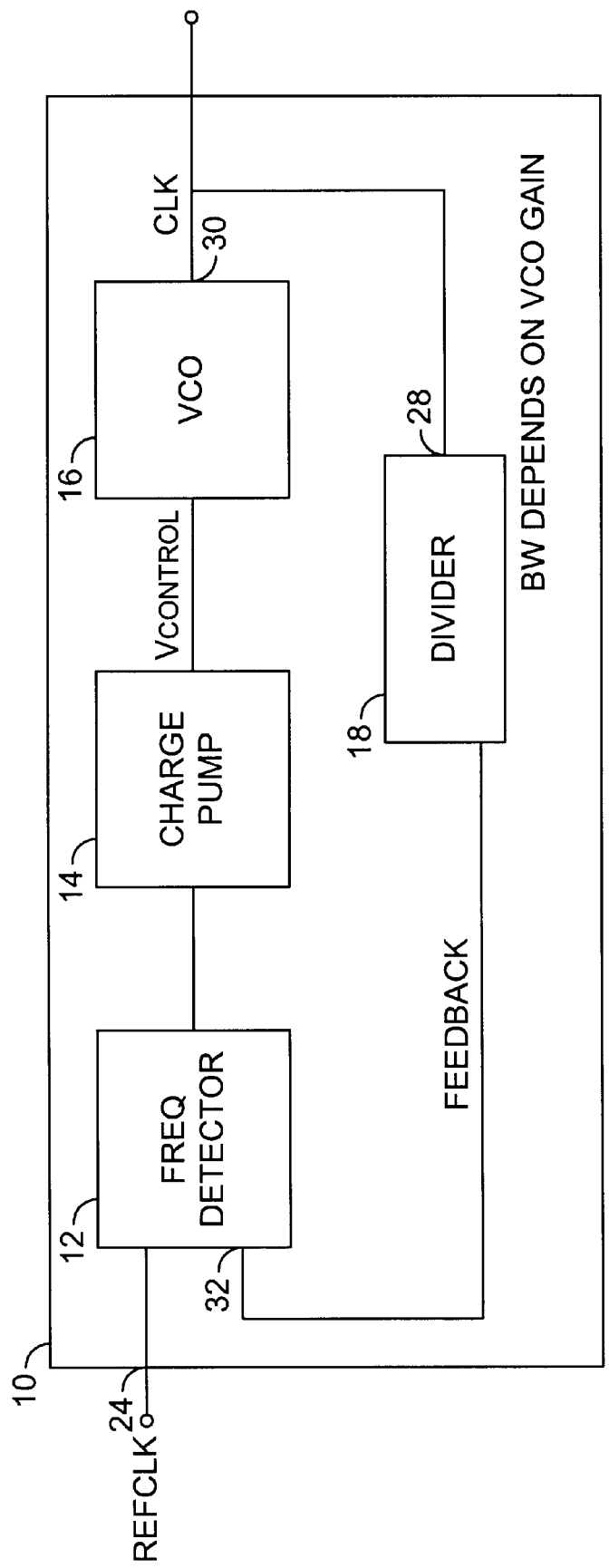
FIG. 1 is a block diagram of a conventional PLL.
Figure 2:
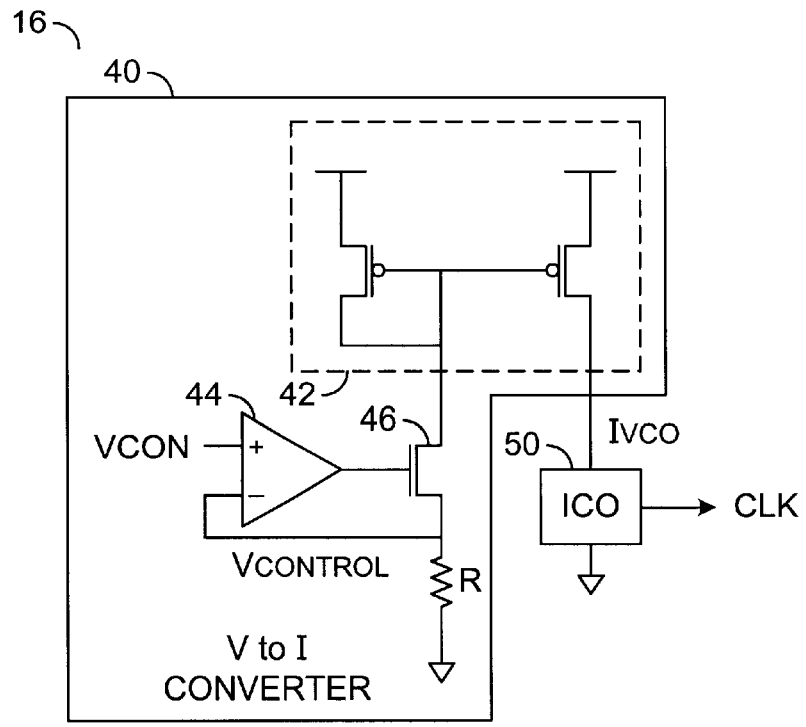
FIG. 2 is a block diagram of the ICO included in the VCO of FIG. 1.
Figure 4:
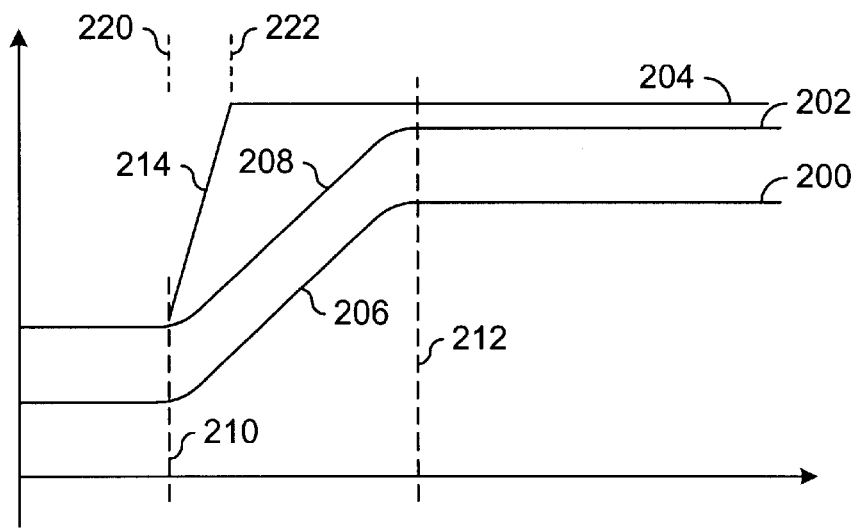
FIG. 4 is a timing diagram illustrating the operation of the circuits of FIG. 2 and FIG. 3.

Referring to FIG. 4, a diagram illustrating the operation of the circuit of FIG. 3 compared to the circuit of FIG. 2 is shown. FIG. 4 includes a waveform 200, a waveform 202 and a waveform 204. The waveform 200 may be a frequency versus current plot of the signal CLK. When the offset current Ioffset is increased or decreased, the waveform 200 may shift up or down on the frequency curve, as illustrated by the waveform 202. A gain curve 206 illustrates a portion of the waveform 200 between a vertical line 210 and a vertical line 212. During the gain curve 206, the output of the signal CLK generally varies linearly in response to the signal Ivco. Similarly, a gain curve 208 provides a generally linearly increase in the frequency of the signal CLK between the vertical lines 210 and 212. As a result, the gain of the circuit 100 generally remains constant while the frequency of oscillation of the signal CLK is varied in response to the offset current Ioffset.

In contrast, the waveform 204 illustrates an example of the operation of the circuit of FIG. 2. Specifically, the gain portion of the curve 204 is shown having a much more steep slope.

As a result, the frequency of the signal CLK is only adjusted between the vertical lines 220 and 222. This reduces the overall adjustability of the signal CLK. The circuit of FIG. 2 changes the slope of the gain portion of the waveform 204 at the same time that it increases the overall oscillation of the signal CLK. Similarly, if the frequency of oscillation of the signal CLK is decreased, the slope of the gain portion 214 would correspondingly decrease. Such changes in the gain portion are undesirable since they directly change the amount of current necessary to adjust the frequency of oscillation of the signal CLK.

The value of the resistor R and the value of the offset current Ioffset may be optimized to achieve the required gain and frequency range. For example, the range of the frequency of oscillation of the signal CLK may be, in one example, varied between 10 and 500 MHz. In one example, the offset current Ioffset may be small compared to the overall value of the current Ivco. However, large adjustments in the signal Ioffset may be implemented accordingly to meet the design criteria of a particular implementation. For example, the offset current Ioffset may be, in one example, between 0 and 2% of the value of the current Ivco. In another example, the current Ioffset may be between 0 and 20% of the value of the signal Ivco. In yet another example, the current Ioffset may be between 0 and 50% of the value of the signal Ivco. In a further example, the current Ioffset may be between 0 and 90% of the value of the signal Ivco. In any event, the signal Ioffset is generally independently variable with respect to the value of the signal VCON or the value of the current Imir. Additionally, the offset current Ioffset may be a negative current that is actually subtracted from the value of the signal Ivco which may decrease the frequency of oscillation of the signal CLK.

The current sources 130a–130n may be adjustable current sources that may provide an optimal value of the offset current Ioffset. For example, the current sources 130a–130n may be adjusted after fabrication of the circuit 100 by various means including fuses, metal mask options, configuration bits from an EEPROM, configuration bits from a digital-to-analog converter (DAC), configuration bits from an analog-to-digital converter (ADC), etc. Additionally, each of the current sources 130a–130n may be independently adjustable.

While the voltage to current converter circuit 105 is shown implemented with P-channel transistors 112 and 116, other transistors, such as N-channel transistors may be implemented accordingly to meet the design criteria of a particular implementation.

The present invention may also be constructed by making the current offset Ioffset a part of the voltage to current converter 105, or by making the current offset Ioffset a part of the current controlled oscillator 106.

The present invention may be used to provide post-production configuration of the frequency of oscillation of the signal CLK. In one example, the post-production configuration may be used to calibrate a particular part to operate within a particular specification. In another example, the post-production configuration may allow a single part to be used in a variety of applications.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   an oscillator configured to generate a periodic signal in response to (i) a control signal configured to vary in response to a resistance and a current mirror output and (ii) a first current configured to vary independently of said resistance; and
   a comparator that, in conjunction with said current mirror output, is configured to generate said control signal.

2. The circuit according to claim 1, wherein said oscillator generates said periodic signal in further response to a second current that varies in response to said control signal.

3. The circuit according to claim 1, wherein said control signal comprises a voltage to current converter circuit output.

4. The circuit according to claim 3, wherein said voltage to current converter circuit comprises an internal resistance that is independent of said first current.

5. The circuit according to claim 4, wherein said oscillator comprises a current controlled oscillator.

6. The circuit according to claim 1, further comprising a current source configured to generate said first current.

7. The circuit according to claim 1, wherein said oscillator is further configured to internally generate said first current.

8. The circuit according to claim 1, wherein said circuit is configured to adjust said first current after production.

9. A phase-locked loop circuit (PLL) comprising the circuit of claim 1, wherein said PLL generates an output signal having a periodic frequency in response to an external reference signal.

10. A phase-locked loop circuit (PLL) comprising:
    an oscillator configured to generate a periodic signal in response to (i) a control signal configured to vary in response to a resistance and a current mirror output, (ii) a first current configured to vary independently of said resistance and (iii) a second current that varies in response to said control signal;
    wherein (A) said PLL generates an output signal having a periodic frequency in response to (i) an external reference signal and (ii) said periodic signal and (B) said first current is adjusted after production of said circuit.

11. A method of generating a periodic signal comprising the steps of:
    (A) generating a variable control signal in response to a resistance, a current mirror output, and a comparator output and
    (B) presenting said variable control signal and a first variable current to an oscillator to generate said periodic signal, said first variable current being variable independent of said resistance.

12. The method according to claim 11, further comprising presenting a second variable current to said oscillator to generate said periodic signal, said second variable current varying in response to said variable control signal.

13. The method according to claim 11, wherein said variable control signal is generated in further response to a voltage to current converter circuit output.

14. The method according to claim 13, wherein said voltage to current converter circuit comprises an internal resistance that is independent of said first variable current.

15. The method according to claim 14, wherein said oscillator comprises a current controlled oscillator.

16. The method according to claim 11, further comprising the step of:

generating said first variable current with a current source.

17. The method according to claim 15, further comprising the step of:

generating said first variable current internally with said oscillator.

18. The apparatus according to claim 3, wherein said comparator comprises an operational amplifier.

* * * * *